(12) United States Patent
Brandenburg et al.

(10) Patent No.: US 11,509,035 B2
(45) Date of Patent: *Nov. 22, 2022

(54) WAVEGUIDE ANTENNA WITH INTEGRATED TEMPERATURE MANAGEMENT

(71) Applicant: Aptiv Technologies Limited, St. Michael (BB)

(72) Inventors: Scott D. Brandenburg, Kokomo, IN (US); David W. Zimmerman, Noblesville, IN (US); Shawn Shi, Thousand Oaks, CA (US)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 17/375,145

(22) Filed: Jul. 14, 2021

(65) Prior Publication Data

US 2021/0344100 A1 Nov. 4, 2021

Related U.S. Application Data

(63) Continuation of application No. 16/735,884, filed on Jan. 7, 2020, now Pat. No. 11,095,014.

(51) Int. Cl.
*H01Q 1/02* (2006.01)
*H01Q 1/22* (2006.01)
*H01Q 13/00* (2006.01)
*H05K 7/20* (2006.01)

(52) U.S. Cl.
CPC ............. *H01Q 1/02* (2013.01); *H01Q 1/22* (2013.01); *H01Q 13/00* (2013.01); *H05K 7/2029* (2013.01)

(58) Field of Classification Search
CPC .......... H01Q 1/102; H01Q 1/22; H01Q 13/00; H01Q 13/06
See application file for complete search history.

(56) References Cited

U.S. PATENT DOCUMENTS

| | | | |
|---|---|---|---|
| 3,699,225 A | 10/1972 | Gubler et al. | |
| 5,316,080 A | 5/1994 | Banks et al. | |
| 5,929,728 A * | 7/1999 | Barnett | H01P 3/121 |
| | | | 333/248 |
| 6,407,922 B1 | 6/2002 | Eckblad et al. | |

(Continued)

FOREIGN PATENT DOCUMENTS

| | | |
|---|---|---|
| DE | 102015108267 A1 | 12/2015 |
| EP | 3346548 A1 | 7/2018 |
| EP | 3346549 A1 | 7/2018 |

OTHER PUBLICATIONS

Extended European Search Report for Application No. EP 20 21 7343 dated May 27, 2021.

*Primary Examiner* — Lam T Mai

(74) *Attorney, Agent, or Firm* — Carlson, Gaskey & Olds, P.C.

(57) ABSTRACT

An illustrative example embodiment of an antenna device includes a substrate, a plurality of antenna elements supported on the substrate, an integrated circuit supported on one side of the substrate, and a metallic waveguide antenna situated against the substrate. The metallic waveguide antenna includes a heat dissipation portion in a thermally conductive relationship with the integrated circuit. The heat dissipation portion is configured to reduce a temperature of the integrated circuit.

15 Claims, 3 Drawing Sheets

(56) References Cited

U.S. PATENT DOCUMENTS

| | | | |
|---|---|---|---|
| 6,832,081 B1* | 12/2004 | Hiramatsu | H01Q 13/28 |
| | | | 455/328 |
| 7,230,832 B2 | 6/2007 | Brandenburg et al. | |
| 7,486,515 B2 | 2/2009 | Brandenburg et al. | |
| 9,131,630 B2 | 9/2015 | Brandenburg et al. | |
| 10,490,479 B1 | 11/2019 | Wan et al. | |
| 11,095,014 B2* | 8/2021 | Brandenburg | H01Q 1/2283 |
| 2012/0006521 A1 | 1/2012 | Moehlenkamp et al. | |
| 2014/0070393 A1 | 3/2014 | Bartley et al. | |
| 2014/0217574 A1 | 8/2014 | Kuczynski et al. | |
| 2014/0252404 A1 | 9/2014 | Takayama et al. | |
| 2017/0170569 A1* | 6/2017 | Elad | H01Q 19/10 |
| 2017/0317005 A1 | 11/2017 | Standing | |
| 2019/0116670 A1 | 4/2019 | Anderson et al. | |
| 2019/0116691 A1 | 4/2019 | Bozorgi | |
| 2019/0267722 A1* | 8/2019 | Yoon | H01Q 1/02 |
| 2019/0346814 A1* | 11/2019 | Fruehling | G04F 5/14 |
| 2020/0091608 A1* | 3/2020 | Alpman | H03L 7/145 |
| 2020/0197935 A1* | 6/2020 | Chen | B01L 3/502707 |
| 2021/0111096 A1 | 4/2021 | Brandenburg | |

* cited by examiner

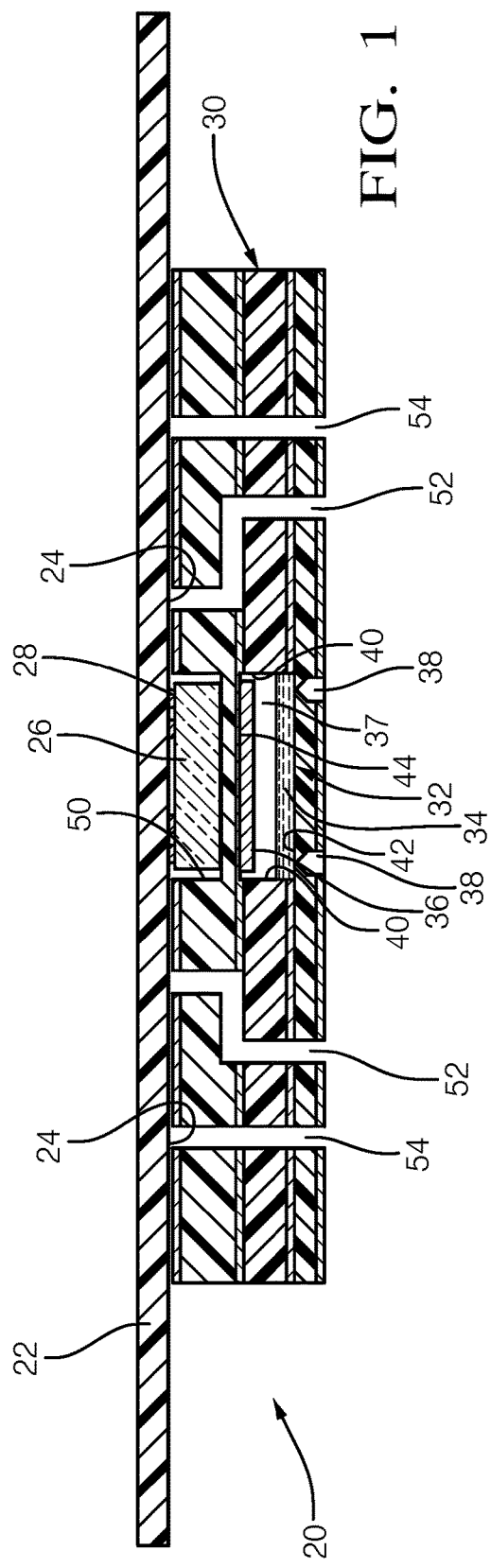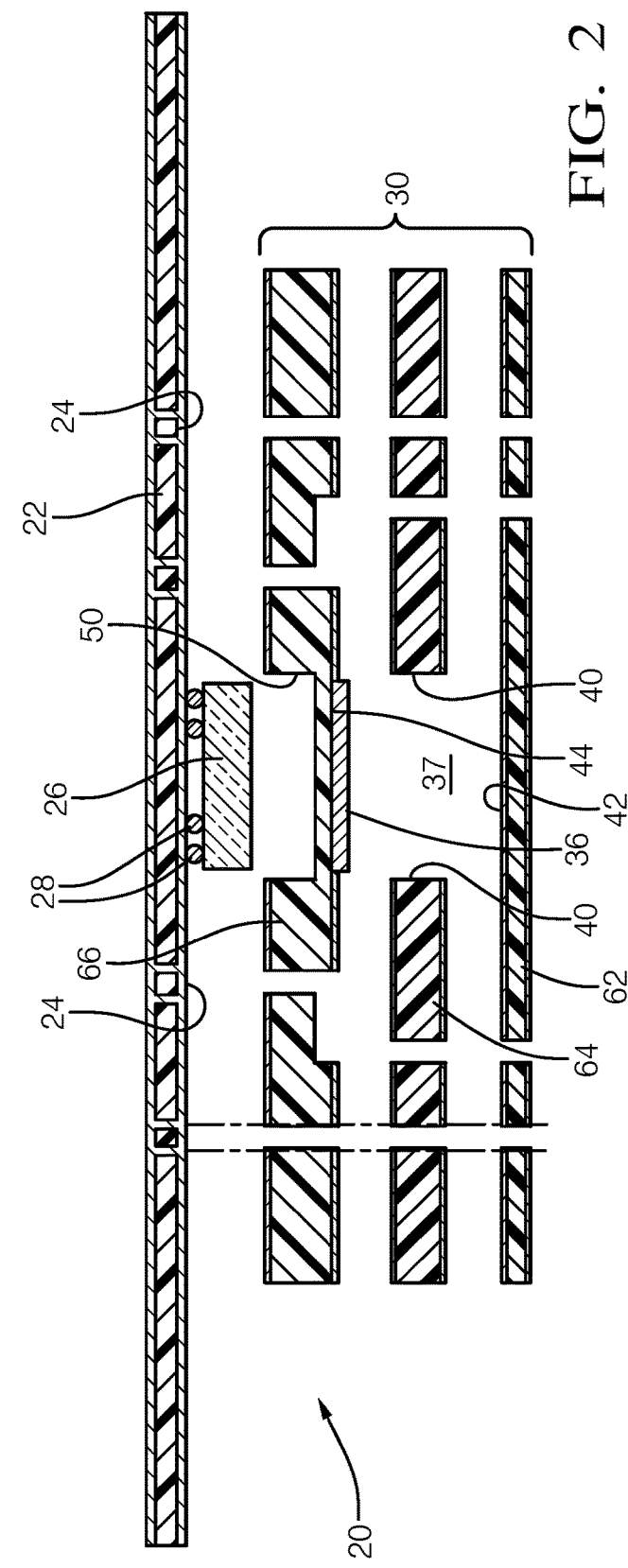

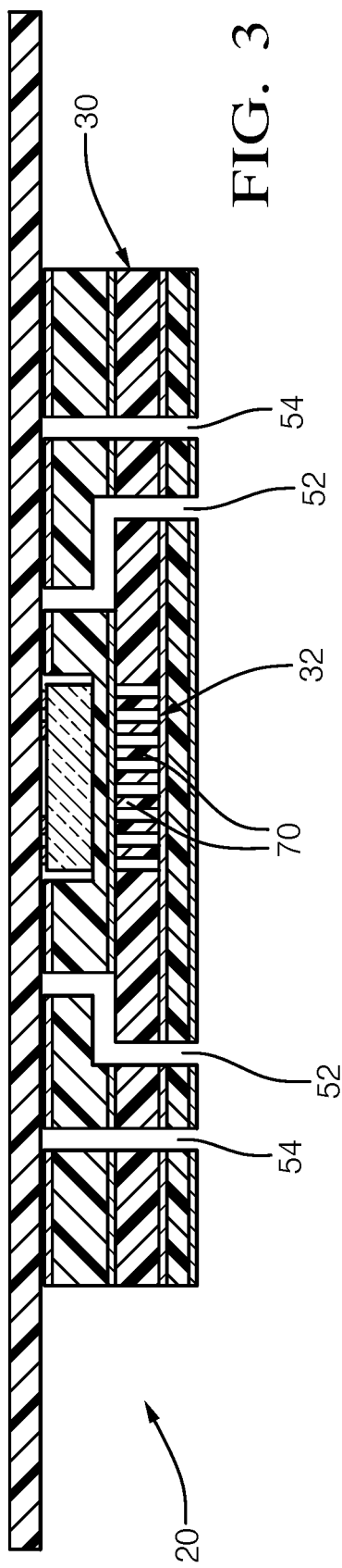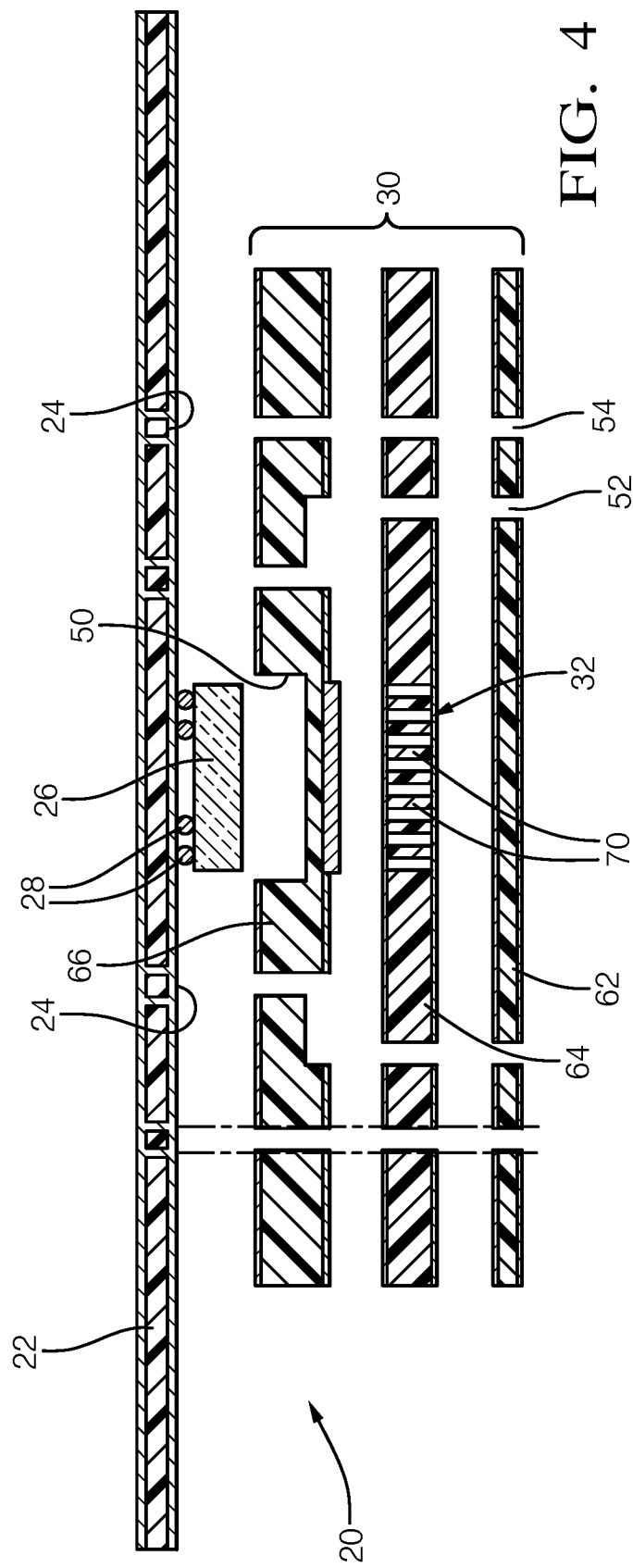

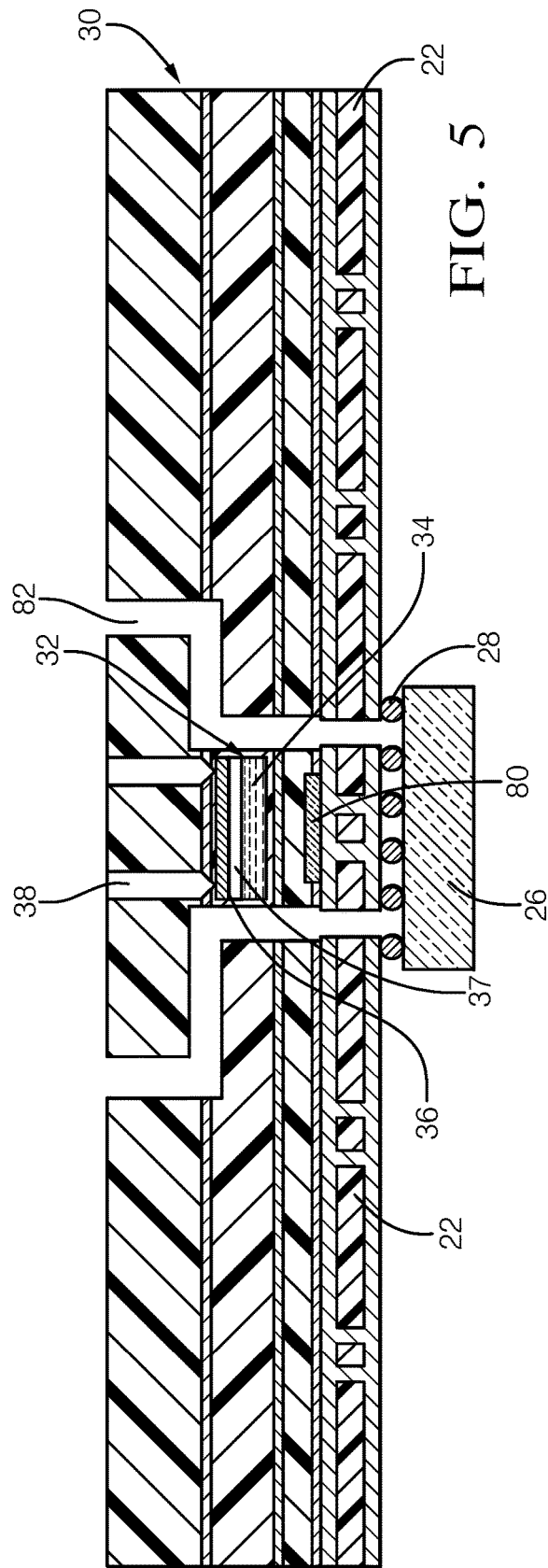
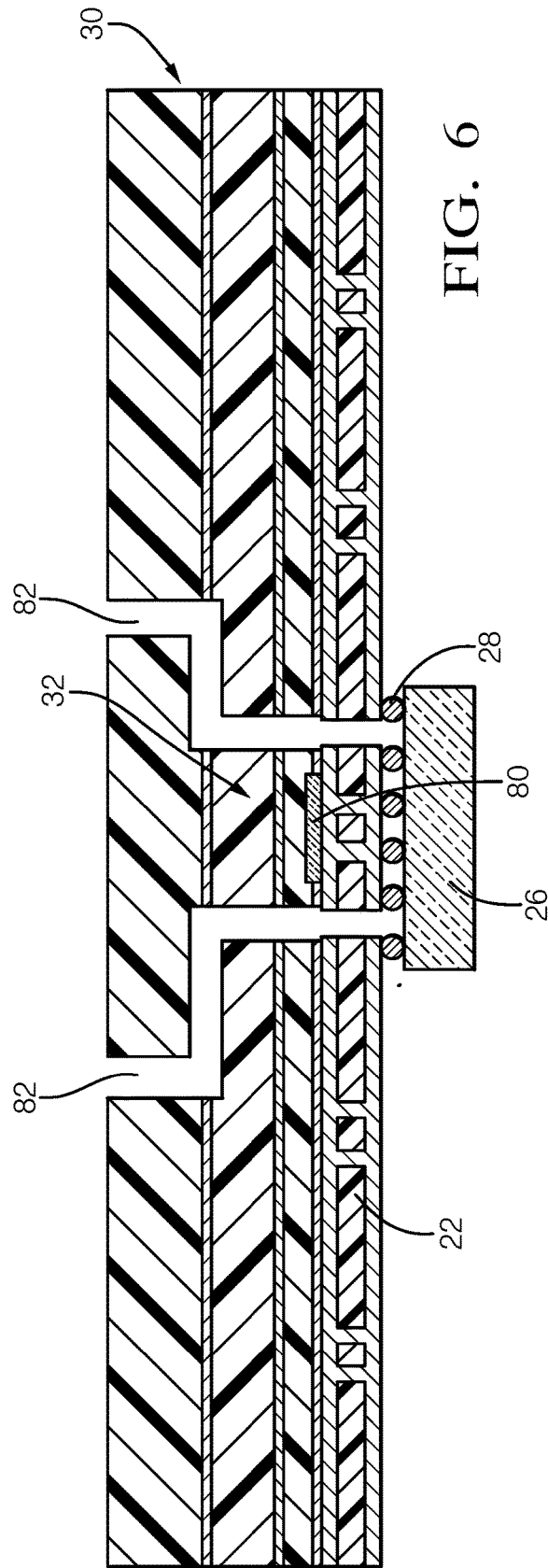

WAVEGUIDE ANTENNA WITH
INTEGRATED TEMPERATURE
MANAGEMENT

CROSS REFERENCE TO RELATED
APPLICATIONS

This application is a continuation of U.S. patent application Ser. No. 16/735,884, filed Jan. 7, 2020.

BACKGROUND

Modern automotive vehicles include an increasing amount of electronic technology, such as sensors, detectors and cameras that provide information regarding the environment near a vehicle to facilitate driver assistance or autonomous vehicle control. Radar detectors, for example, include antennas for transmitting and receiving signals. Some antenna configurations include an array of antenna elements to achieve a desired gain and directivity.

Some antenna configurations include patch antenna elements supported on a printed circuit board. The integrated circuit associated with the antenna elements is usually supported on the printed circuit board. One disadvantage of such arrangements is the limited heat transfer from the integrated circuit to the board through the solder balls that typically secure the integrated circuit to the board.

SUMMARY

An illustrative example embodiment of an antenna includes at least one antenna element, an integrated circuit operatively associated with the antenna element and a waveguide situated near the antenna element. The waveguide includes at least one passage through which radiation may pass toward or away from the antenna element. The waveguide has a heat dissipation portion at least partially within the waveguide. The heat dissipation portion is in a thermally conductive relationship with the integrated circuit and configured to reduce a temperature of the integrated circuit In an embodiment having one or more features of the antenna of the previous paragraph, the heat dissipation portion comprises a heat exchanger including a plurality of metallic members arranged to allow fluid flow between the metallic members.

In an embodiment having one or more features of the antenna of any of the previous paragraphs, the metallic members comprise fins.

In an embodiment having one or more features of the antenna of any of the previous paragraphs, the heat dissipation portion comprises a chamber configured to contain a fluid for absorbing heat from the integrated circuit.

In an embodiment having one or more features of the antenna of any of the previous paragraphs, the chamber defines a first volume within the chamber, the fluid is a liquid, and the liquid has a second volume that is less than the first volume.

In an embodiment having one or more features of the antenna of any of the previous paragraphs, the second volume is between 10% and 60% of the first volume.

In an embodiment having one or more features of the antenna of any of the previous paragraphs, the second volume is 30% of the first volume.

In an embodiment having one or more features of the antenna of any of the previous paragraphs, the liquid is at least one of water, ethylene glycol and acetone.

An embodiment having one or more features of the antenna of any of the previous paragraphs includes a wicking structure situated in the chamber, the wicking structure being configured to facilitate circulation of a vaporized portion of the liquid back into the liquid.

In an embodiment having one or more features of the antenna of any of the previous paragraphs, the metallic waveguide antenna comprises copper, the wicking structure comprises a sinter paste or a copper etching, and the sinter paste or the copper etching is situated on a surface within the chamber that is closer to the integrated circuit than the liquid.

In an embodiment having one or more features of the antenna of any of the previous paragraphs, the waveguide is on the one side of the substrate, the waveguide includes a cavity configured to receive the integrated circuit, and the cavity provides electromagnetic shielding around the integrated circuit.

In an embodiment having one or more features of the antenna of any of the previous paragraphs, the waveguide is on a second side of the substrate opposite from the one side and the heat dissipation portion includes a thermal interface material against the substrate and aligned with the integrated circuit.

In an embodiment having one or more features of the antenna of any of the previous paragraphs, the waveguide comprises a plurality of layers of metallic material secured together and at least one of the layers includes the heat dissipation portion.

In an embodiment having one or more features of the antenna of any of the previous paragraphs, the heat dissipation portion comprises a chamber, the at least one of the layers defines at least two interior surfaces of the chamber, and at least on other of the layers defines at least one interior surface of the chamber.

The various features and advantages of at least one disclosed example embodiment will become apparent to those skilled in the art from the following detailed description. The drawings that accompany the detailed description can be briefly described as follows.

BRIEF DESCRIPTION OF THE DRAWINGS

FIG. 1 schematically illustrates an antenna device designed according to an example embodiment.

FIG. 2 is an exploded view of the embodiment of FIG. 1 showing components prior to final assembly.

FIG. 3 schematically illustrates another example embodiment of an antenna device.

FIG. 4 is an exploded view showing components of the embodiment of FIG. 3 prior to final assembly.

FIG. 5 schematically illustrates another example antenna device embodiment.

FIG. 6 schematically illustrates another example antenna device embodiment.

DETAILED DESCRIPTION

FIG. 1 schematically illustrates an antenna device 20. A substrate 22 supports a plurality of antenna elements 24 on at least one side of the substrate 22. The substrate 22 and antenna elements 24 in the example embodiment have a known configuration and are made using a known manufacturing or fabrication process.

An integrated circuit 26 is secured to one side of the substrate 22. In the illustrated example, the integrated circuit 26 is secured to the substrate 22 by solder balls 28 that also establish electrically conductive connections between the integrated circuit 26, the antenna elements 24 and any other portions or elements supported on the substrate 22 as may be required for a particular situation. The integrated circuit 26 in the illustrated example is a millimeter wave integrated circuit that is useful for radar devices, for example.

A metallic waveguide antenna 30 is situated against the substrate 22. The metallic waveguide antenna 30 includes an integrated heat dissipation portion 32 that is in a thermally conductive relationship with the integrated circuit 26. The heat dissipation portion 32 is configured to reduce the temperature of the integrated circuit 26 by absorbing heat from the integrated circuit 26.

In the example embodiment of FIG. 1, the heat dissipation portion 32 includes a fluid 34 and a wicking structure 36 within a chamber 37 having a first volume defined between side walls 40 and end walls 42 and 44. In the illustrated embodiment the wicking structure 36 is supported on the end wall 44. In some embodiments the wicking structure 36 comprises a sinter paste while in other embodiments the wicking structure 36 comprises etched copper. The wicking structure provides increased surface area for heat exchange between the integrated circuit 26 and the fluid 34. The wicking structure facilitates circulation of vaporized fluid back into the liquid form within the chamber of the heat dissipation portion 32.

In the illustrated example embodiment, the fluid 34 comprises a liquid, such as water, ethylene glycol, acetone, or a combination of them. The liquid has a second volume that is less than the first volume of the chamber. The liquid occupies between 10% and 60% of the first volume of the chamber 37. In some embodiments, the liquid 34 occupies 30% of the first volume of the chamber 37 defined between the side walls 40 and the end walls 42 and 44. The illustrated example includes fluid ports 38 to selectively increase or decrease the amount of fluid 34 within the heat dissipation portion 32.

The metallic waveguide antenna 30 includes air waveguides 52 and 54 through which radiation from the antenna elements 24 radiate during signal transmission, for example.

FIG. 2 illustrates the embodiment of FIG. 1 prior to final assembly. The metallic waveguide antenna 30 is made of a plurality of layers of metal, such as copper. The illustrated example includes three layers 62, 64 and 66. Each of the layers comprises a stamping or a punched piece of metal. The layers 62, 64 and 66 are secured together. In embodiments where the layers comprise copper, a solder reflow process secures the layers together.

The layer 66 defines a cavity 50 that receives the integrated circuit 26. One feature of the cavity 50 is that it provides electromagnetic shielding to the integrated circuit 26.

The manner in which each of the layers is stamped establishes the air waveguides 52 and 54 when the layers are secured together. In the example of FIG. 2, the layer 62 includes a surface that establishes the end wall 42 of the chamber 37. The layer 64 defines the side walls 40 of that chamber and the layer 66 defines the end wall 44. The wicking structure 36 is secured to the layer 66 or otherwise formed on it prior to securing the layers together. Once the layers 62-66 are secured together, the fluid 34 may be introduced into the chamber 37 of the heat dissipation portion 32 through the fluid ports 38.

While three layers are shown in the example embodiment of FIGS. 1 and 2, other embodiments include more layers or only two layers of a metal material to form the metallic waveguide antenna with the integrated heat dissipation portion 32.

Another example embodiment is shown in FIGS. 3 and 4. In this example, the heat dissipation portion 32 comprises a heat exchanger that includes a plurality of metallic members 70 that are arranged to allow fluid flow between them to facilitate heat exchange between the integrated circuit 26 and the heat dissipation portion 32. The fluid within the heat exchanger comprises air in some embodiments. Other embodiments may include a liquid or gel to facilitate heat transfer for reducing a temperature of the integrated circuit 26.

As can be appreciated from FIG. 4, the metallic members 70 may be formed as part of the layer 64. Alternatively, a set of pins, posts, or fins are situated in the section of the assembly where the heat dissipation portion 32 will be established. In some embodiments, the metallic members 70 will be formed using an etching process or during stamping of the layer 64.

In some embodiments, the antenna device includes or has an associated fan or blower that moves air through the heat exchanger heat dissipation portion 32 so that the metallic member 70 more effectively provides cooling for the integrated circuit 26.

FIG. 5 schematically illustrates another example embodiment. In the embodiments shown in FIGS. 1-4, the metallic waveguide antenna 30 was situated on the same side of the substrate 22 as the integrated circuit 26. In the embodiment of FIG. 5, the metallic waveguide antenna 30 is situated on an opposite side of the substrate 22. In this embodiment, the heat dissipation portion 32 contains fluid, such as water or acetone, like the embodiment of FIG. 1. Since the metallic waveguide antenna 30 is on an opposite side of the substrate 22, a thermal interface material 80 is included between the substrate 22 and the heat dissipation portion 32 to facilitate heat transfer for maintaining a desired temperature of the integrated circuit 26. The heat dissipation portion 32 is situated between air waveguides 82 in this embodiment.

Another example embodiment is shown in FIG. 6 where the metallic waveguide antenna 30 is situated on the opposite side of the substrate 22 from the integrated circuit 26. A thermal interface material 80 is situated between a metallic pedestal that serves as the heat dissipation portion 32 and the substrate 22. The metallic pedestal is situated between the air waveguides 82.

The illustrated example embodiments include an integrated heat dissipation portion within a metallic waveguide antenna. Making the waveguide antenna using a plurality of stampings or layers of metal provides an economical and lightweight arrangement that meets the needs of automotive radar detectors, for example. The example antenna devices include a low loss package and a low loss routing line. Embodiments, such as those described above, provide a low loss antenna with enhanced thermal dissipation characteristics.

The various features of the disclosed embodiments are not necessarily limited to the arrangements that are shown. Other combinations of the disclosed features are possible to realize additional or different embodiments.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. An antenna, comprising:
   at least one antenna element;
   an integrated circuit operatively associated with the at least one antenna element; and
   a waveguide situated near the at least one antenna element, the waveguide including at least one passage through which radiation may pass toward or away from the at least one antenna element, the waveguide having a heat dissipation portion at least partially within the waveguide, the heat dissipation portion being in a thermally conductive relationship with the integrated circuit and configured to reduce a temperature of the integrated circuit.

2. The antenna of claim 1, wherein the heat dissipation portion comprises a heat exchanger including a plurality of metallic members arranged to allow fluid flow between the metallic members.

3. The antenna of claim 2, wherein the metallic members comprise fins.

4. The antenna of claim 1, wherein the heat dissipation portion comprises a chamber configured to contain a fluid for absorbing heat from the integrated circuit.

5. The antenna of claim 4, wherein
   the chamber defines a first volume within the chamber;
   the fluid is a liquid; and
   the liquid has a second volume that is less than the first volume.

6. The antenna of claim 5, wherein the second volume is between 10% and 60% of the first volume.

7. The antenna of claim 6, wherein the second volume is 30% of the first volume.

8. The antenna of claim 5, wherein the liquid is at least one of water, ethylene glycol and acetone.

9. The antenna of claim 5, comprising a wicking structure situated in the chamber, the wicking structure being configured to facilitate circulation of a vaporized portion of the liquid back into the liquid.

10. The antenna of claim 9, wherein
    the waveguide comprises copper;
    the wicking structure comprises a sinter paste or a copper etching; and
    the sinter paste or the copper etching is situated on a surface within the chamber that is closer to the integrated circuit than the liquid.

11. The antenna of claim 1, wherein
    the waveguide includes a cavity configured to receive the integrated circuit; and
    the cavity provides electromagnetic shielding around the integrated circuit.

12. The antenna of claim 1, wherein
    the waveguide comprises a plurality of layers of metallic material secured together; and
    at least one of the layers includes the heat dissipation portion.

13. The antenna of claim 12, wherein
    the heat dissipation portion comprises a chamber;
    the at least one of the layers defines at least two interior surfaces of the chamber; and
    at least one other of the layers defines at least one interior surface of the chamber.

14. The antenna of claim 1, wherein
    the at least one antenna element comprises a plurality of antenna elements;
    the at least one passage comprises a plurality of passages; and
    each of the passages is aligned with one of the antenna elements.

15. The antenna of claim 14, wherein
    the waveguide comprises a thermally conductive material; and
    the heat dissipation portion is situated between two of the passages such that at least some heat dissipated by the heat dissipation portion escapes through the two of the passages.

\* \* \* \* \*